United States Patent
Haga et al.

Patent Number: 6,002,631
Date of Patent: Dec. 14, 1999

[54] SEMICONDUCTOR MEMORY DEVICE HAVING A MODE IN WHICH A PLURALITY OF DATA ARE SIMULTANEOUSLY READ OUT OF MEMORY CELLS OF ONE ROW AND DIFFERENT COLUMNS

[75] Inventors: Ryo Haga, Yokohama; Tomoaki Yabe, Fujisawa; Shinji Miyano, Yokohama, all of Japan

[73] Assignee: Kabushiki Kaisha Toshiba, Kawasaki, Japan

[21] Appl. No.: 08/982,534

[22] Filed: Dec. 2, 1997

[30] Foreign Application Priority Data

Dec. 2, 1996 [JP] Japan .................................. 8-321739

[51] Int. Cl.⁶ ..................................................... G11C 8/00
[52] U.S. Cl. ............................... 365/230.03; 365/230.04; 365/230.01
[58] Field of Search ....................... 365/230.03, 230.05, 365/185.11, 230.07, 189.07, 230.04

[56] References Cited

U.S. PATENT DOCUMENTS

| | | | |
|---|---|---|---|
| 3,846,765 | 11/1974 | De Vries | 340/173 |
| 4,247,920 | 1/1981 | Springer et al. | 365/230 |
| 5,247,644 | 9/1993 | Johnson et al. | 365/230.03 |
| 5,261,064 | 11/1993 | Wyland | 395/400 |
| 5,453,957 | 9/1995 | Norris et al. | 365/230.04 |
| 5,590,084 | 12/1996 | Miyano et al. | 365/230.01 |
| 5,748,555 | 5/1998 | Park | 365/230.04 |

*Primary Examiner*—David Nelms
*Assistant Examiner*—Tuan T. Nguyen
*Attorney, Agent, or Firm*—Banner & Witcoff, Ltd.

[57] ABSTRACT

Even-numbered columns are arranged in the first memory cell array (bank), and odd-numbered columns are arranged in the second memory cell array (bank). A column address signal is input to an adder through a buffer. When data is read out of two or more columns, the adder generates a column address signal whose address value is more than that of the column address signal by one. The adder supplies a first column decoder with a column address signal for addressing an even-numbered column and supplies a second column decoder with a column address signal for addressing an odd-numbered column. Since the even-numbered columns and odd-numbered columns are arranged in their separate memory cell arrays, data read out of continuous two or more columns do not collide with each other.

12 Claims, 13 Drawing Sheets

SEMICONDUCTOR MEMORY DEVICE HAVING A MODE IN WHICH A PLURALITY OF DATA ARE SIMULTANEOUSLY READ OUT OF MEMORY CELLS OF ONE ROW AND DIFFERENT COLUMNS

BACKGROUND OF THE INVENTION

The present invention relates to a semiconductor memory device having a mode in which a plurality of data are simultaneously read out of memory cells of one row and different columns.

FIG. 1 illustrates the layout of a prior art DRAM. In the DRAM, a row decoder 11 is arranged at one end of a memory cell array 10 in its row direction (along which a word line extends). The row decoder 11 is supplied with a row address signal via a row address buffer 12.

A row address strobe signal $\overline{RAS}$ is input to a row system control circuit 13. A word line control circuit 14 is controlled in response to an output signal of the circuit 13 and applies a high potential to a word line of the memory cell array 10 selected by the row address signal.

A sense amplifier 15 is arranged at another end of the memory cell array 10 in its column direction (along which a pair of bit lines extends). The sense amplifier 15 is activated or inactivated by a sense amplifier control circuit 16.

The sense amplifier control circuit 16 operates in response to an output signal SEN of the word line control circuit 14. More specifically, if a row of the memory cell array 10 is selected and a high potential is applied to the word line, the sense amplifier control circuit 16 outputs signals SAP and BSAN for activating the sense amplifier 15.

A column address signal is supplied to a column decoder 18 through a column address buffer 17. A column address strobe signal $\overline{CAS}$ is input to a column system control circuit 25. The column address buffer 17 is controlled in response to an output signal of the circuit 25.

The column decoder 18 opens and closes a column select gate 19 in response to the column address signal. In other words, the column decoder 18 activates a predetermined one column select line CSLn.

A column logic circuit 26 is supplied with control signals RB and DB. When the control signal RB is at a high level and the control signal DB is at a low level, the circuit 26 guides the output signal of the column decoder 18 to the column select gate 19 as it is. In other words, the column select gate 19 corresponding to the column select line CSLn in an activation state, is turned on, and data is read out through the column select gate 19.

When the control signals RB and DB are both at a high level, the column logic circuit 26 activates continuous two column select lines CSLn and CSLn+1.

Two column select gates 19 corresponding to the activated column select lines CSLn and CSLn+1 are turned on, and data is read out through each of the column select lines.

A data bus (hereinafter referred to as a DQ bus) 20 is a data path connected between the column select gate 19 and data input/output (I/O) buffer 21.

FIG. 2 shows an example of the layout of the column logic circuit 26 of the DRAM in FIG. 1.

In the column logic circuit 26, the control signal RB is input to a NAND circuit 27-k1 (k=0, 1, . . . , n) via inverters IN1 and IN2 and also input to a NAND circuit NAND, while the control signal DB is input to the NAND circuit NAND.

An output signal of the NAND circuit NAND is supplied to a NAND circuit 27-k0 (k=0, 1, . . . , n) through an inverter IN3.

A column select signal CSLPk (k=0, 1, . . . , n) output from the column decoder, is input to the NAND circuits 27-k1 and 27-(k+1)0. However, a column select signal CSLPn is input to the NAND circuits 27-n1 and 27-00.

The output signal of the NAND circuit 27-k0 is supplied to a NOR circuit 28-k via an inverter Ik0 (k=0, 1, . . . , n). The output signal of the NAND circuit 27-k1 is input to the NOR circuit 28-k via an inverter Ik1.

If the output signal of the NOR circuit 28-k passes through the inverter Ik (k=0, 1, . . . , n), it changes to a final column select signal CSLk.

The foregoing column logic circuit is designed to switch a mode for reading data out of only one column corresponding to the column address signal and a mode for reading data out of a column corresponding to the column address signal and two columns continuous therewith.

FIG. 3 illustrates an operation of the DRAM of FIG. 1 and that of the column logic circuit of FIG. 2.

When a row address strobe signal RAS changes from a high level to a low level, a row address signal is supplied into a memory chip (semiconductor memory device) in accordance with the change. In response to the row address signal, the row decoder selects a predetermined one row from the memory cell array.

When a column address strobe signal CAS changes from a high level to a low level, a column address signal is supplied into the memory chip in accordance with the change. In response to the column address signal, the column decoder outputs a column select signal CSLPk (k=0, 1, . . . , n) for selecting a predetermined one column from the memory cell array. This signal CSLPk is input to the column logic circuit.

a) When data is read out of only one column:

The control signal RB is at a high level and the control signal DB is at a low level.

Assuming that one column select signal CSLPk (k=any one of 0, 1, . . . , n) is at a high level (in an active state) and the other column select signals CSLP0 to CSLPk-1 and CSLPk+1 to CSLPn are at a low level, the output signals of NAND circuits 27-00 to 27-n0, 27-01 to 27-(k-1)1, and 27-(k+1)1 to 27-n1 become low in level, and only the output signal of NAND circuit 27-k1 becomes high in level. Accordingly, the level of only the output signal of NOR circuit 28-k becomes low and that of only the column select signal CSLk becomes high. The column select signal CSLk turns on a column select gate of a predetermined one column.

b) When data is read out of continuous two columns:

The control signals RB and DB are both at a high level.

Assuming that one column select signal CSLPk (k=any one of 0, 1, . . . , n) is at a high level (in an active state) and the other column select signals CSLP0 to CSLPk-1 and CSLPk+1 to CSLPn is at a low level, the output signals of NAND circuits 27-00 to 27-n0, 27-01 to 27-(k-1)1, and 27-(k+1)1 to 27-n1 become low in level, and those of NAND circuits 27-k1 and 27-(k+1)1 become high in level. Accordingly, the levels of the output signals of NOR circuits 28-k and 28-(k+1) become low and those of the column select signals CSLk and CSLk+1 become high. The column select signals CSLk and CSLk+1 turn on a column select gate of predetermined two columns.

FIG. 4 is a first example of the layout of the memory cell array 10, sense amplifier 15 and column select gate 19 of the DRAM shown in FIG. 1.

The memory cell array 10 is constituted of m blocks BK1, BK2, . . . , BKm, and the number of bits, which can be read and written at once when only one column is selected from the memory cell array, is m bits (×m). The configurations of these blocks BK1, BK2, . . . , BKm are the same.

A word line 24 extends from the row decoder 11 to a plurality of memory cells 23 disposed on the blocks BK1, BK2, . . . , BKm and belonging to the same row of the memory cell array 10.

Each of the blocks has four columns C0 to C3, and a pair of bit lines 22 is formed in each of the columns. The memory cells 23 belonging to the same column of the memory cell array 10 are connected to the bit lines 22.

The pairs of bit lines 22 are connected to their corresponding pairs of data lines (hereinafter referred to as DQ line pairs) 20-0 and 20-1 via sense amplifiers 15-0 to 15-3 and column select gates 19-0 to 19-3.

The sense amplifiers 15-0 to 15-3 are activated or inactivated in response to control signals SAP and BSAN. The column select gates 19-0 to 19-3 are opened and closed in response to column select signals CSL0 to CSL3 output from the column decoder.

Since, normally, one column is selected in one block, one of the four column select gates 19-0 to 19-3 is turned on. When two columns are selected, two of the four column select gates are turned on and, in this case, the number of bits, which can be read and written at once, is 2 m bits (×2 m). The column select gates 19-0 to 19-3 are constituted of, e.g., N-channel MOS transistors.

The feature of the DRAM having the foregoing layout lies in that data of even-numbered columns C0 and C2 is guided to one (20-0) of the DQ line pairs and that of odd-numbered columns C1 and C3 is guided to the other DQ line pair 20-1. In this layout, when data are simultaneously read out of continuous two columns, they do not collide with each other.

In the layout shown in FIG. 4, however, when data are simultaneously read out of continuous three or more columns, they collide with each other. Consequently, the prior art DRAM has the drawback wherein data cannot be simultaneously read out of continuous three or more columns in order to achieve high-speed data transfer.

FIG. 5 is a second example of the layout of the memory cell array 10, sense amplifier 15 and column select gate 19 of the DRAM shown in FIG. 1.

The memory cell array 10 is constituted of m blocks BK1, BK2, . . . , BKm, and the number of bits, which can be read and written at once when only one column is selected from the memory cell array, is bits (×m). The configurations of the blocks BK1, BK2, . . . , BKm are the same.

A word line 24 extends from the row decoder 11 to a plurality of memory cells 23 disposed on the blocks BK1, BK2, . . . , BKm and belonging to the same row of the memory cell array 10.

Each of the blocks has eight columns C0 to C7, and a pair of bit lines 22 is formed in each of the columns. The memory cells 23 belonging to the same column of the memory cell array 10 are connected to the bit lines 22.

The pairs of bit lines 22 are connected to their corresponding DQ line pairs 20-1 via sense amplifiers 15-0 to 15-7, column select gates 19-0 to 19-7, and a switch 29.

The sense amplifiers 15-0 to 15-7 are activated or inactivated in response to control signals SAP and BSAN. The column select gates 19-0 to 19-7 are opened and closed in response to column select signals CSL0 to CSL7 output from the column decoder.

Since, normally, one column is selected in one block, one of the eight column select gates 19-0 to 19-7 is turned on. When two columns are selected, two of the eight column select gates are turned on and, in this case, the number of bits, which can be read and written at once, is 2 m bits (×2 m). The column select gates 19-0 to 19-7 are constituted of, e.g., N-channel MOS transistors.

The feature of the DRAM having the foregoing layout lies in that data of all the columns C0 to C7 is guided to the DQ line pair 20-1. In this DRAM, a memory chip can be reduced in size by arranging the DQ line pairs 20-1 to 20-m on the memory cell array 10.

In the layout illustrated in FIG. 5, when data are simultaneously read out of continuous two or more columns, they collide with each other. Consequently, the prior art DRAM has the drawback wherein data cannot be simultaneously read out of continuous two or more columns in order to achieve high-speed data transfer.

BRIEF SUMMARY OF THE INVENTION

The present invention has been developed in order to resolve the above drawback and its object is to provide a semiconductor memory device having a novel layout in which data can be simultaneously read out of continuous two or more columns without any collision between the data.

To attain the above object, according to one aspect of the present invention, there is provided a semiconductor memory device having a mode in which data is read out of one column of a memory cell array and a mode in which a plurality of data are simultaneously read out of continuous two or more columns. The memory cell array includes two banks. Even-numbered columns are arranged in one of the banks and odd-numbered columns are arranged in the other bank.

A bit line pair formed in one of continuous two even-numbered columns is connected to a DQ line pair formed on one side of the bank in which the even-numbered columns are arranged, and a bit line pair formed in the other of the continuous two even-numbered columns is connected to a DQ line pair formed on the other side of the bank in which the even-numbered columns are arranged.

Similarly, a bit line pair formed in one of continuous two odd-numbered columns is connected to a DQ line pair formed on one side of the bank in which the odd-numbered columns are arranged, and a bit line pair formed in the other of the continuous two odd-numbered columns is connected to a DQ line pair formed on the other side of the bank in which the odd-numbered columns are arranged.

In the mode where a plurality of data are simultaneously read out of continuous two or more columns of the memory cell array, the semiconductor memory device includes a means for, in response to a column address signal for selecting one column of the memory cell array, generating a column address signal whose address value is shifted from that of the column address signal by one, a first column decoder for decoding a column address signal for selecting an even-numbered column to generate a first column select signal, and a second column decoder for decoding a column address signal for selecting an odd-numbered column to generate a second column select signal.

The semiconductor memory device further includes a first column logic circuit for generating a third column select signal for selecting a column continuous with the column selected by the first column select signal and a second column logic circuit for generating a fourth column select signal for selecting a column continuous with the column selected by the second column select signal.

In the semiconductor memory device, m-bit (m is a natural number) data are simultaneously read out of one column of the memory cell array.

According to another aspect of the present invention, there is provided a semiconductor memory device having a mode in which data is read out of one column of a memory cell array and a mode in which a plurality of data are simultaneously read out of continuous two or more columns. The memory cell array includes a plurality of banks. Each of the banks has the columns so as to prevent the plurality of data from being read out of the same bank.

A plurality of bit line pairs arranged in the columns of each of the plurality of banks are connected to one DQ line pair. The DQ line pair is arranged on the bank of the memory cell array.

In the semiconductor memory device m-bit (m is a natural number) data are simultaneously read out of one column of the memory cell array.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A semiconductor memory device of the present invention will now be described in detail with reference to the accompanying drawings.

Figure 1:
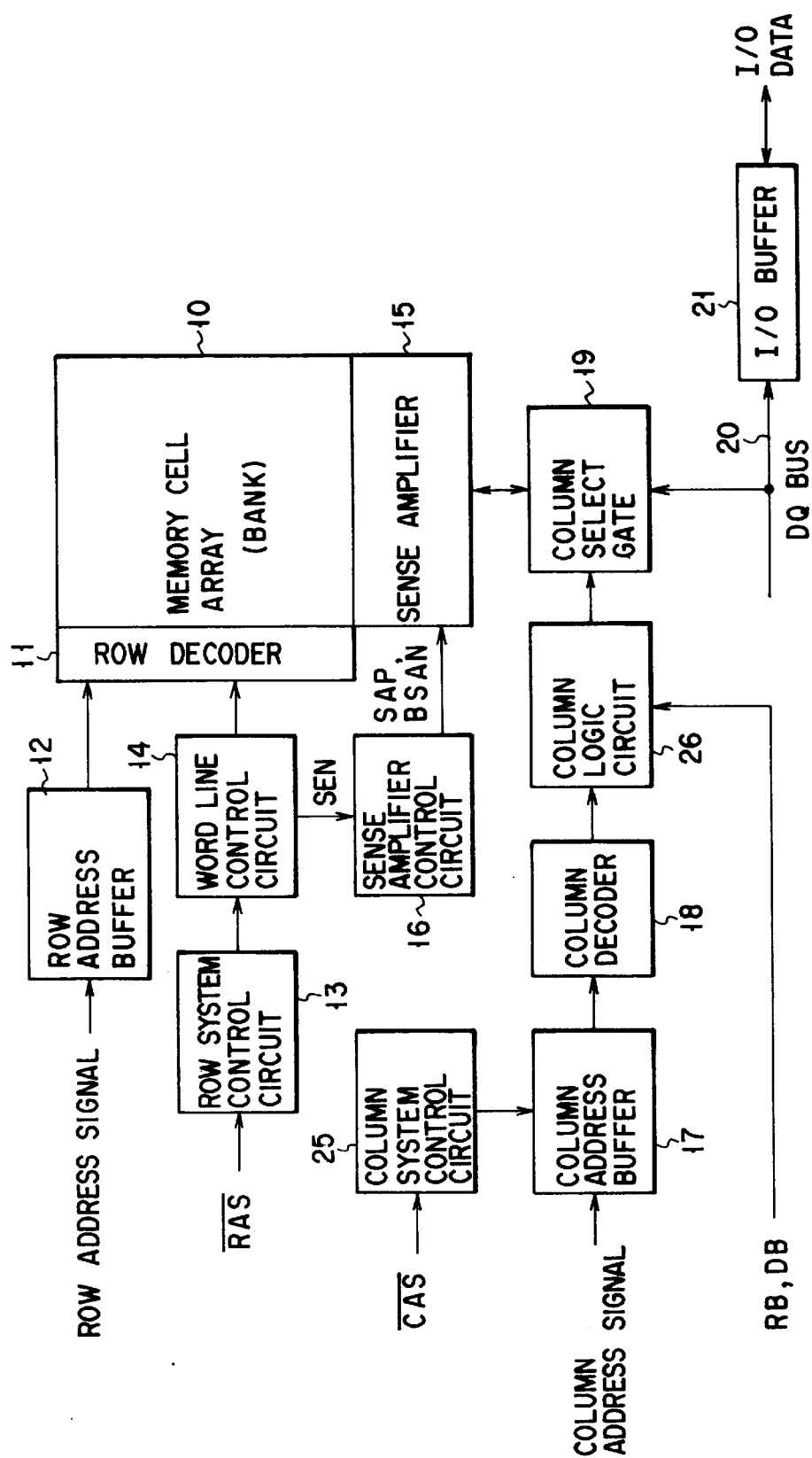
FIG. 1 is a block diagram illustrating a layout of a prior art DRAM.
Figure 2:
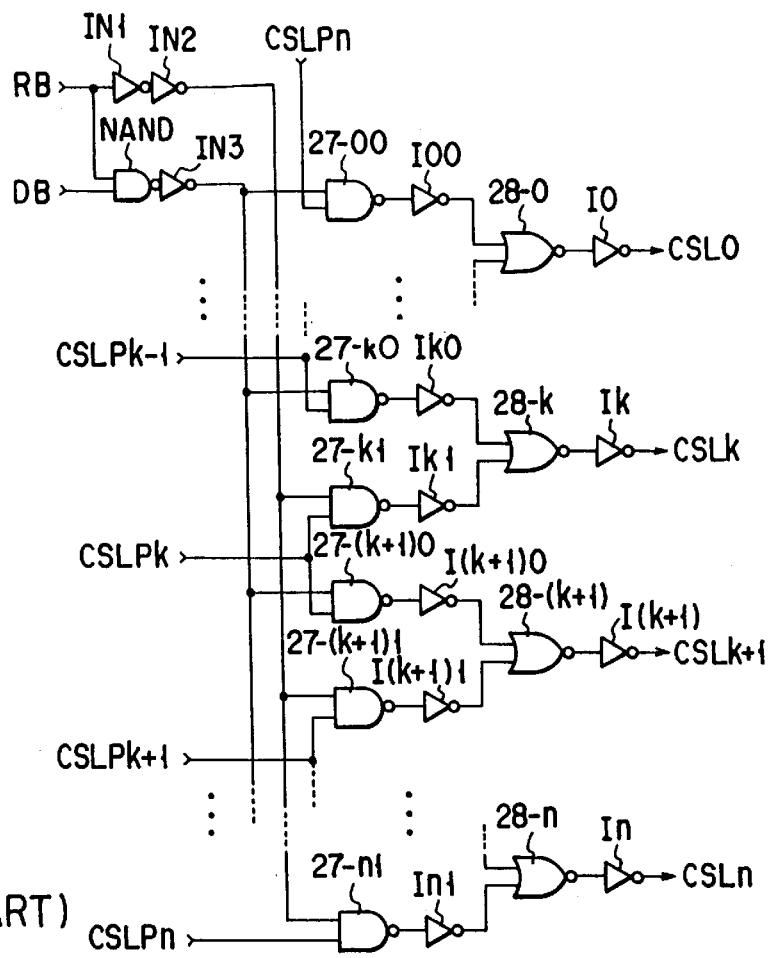
FIG. 2 is a diagram showing an example of the layout of a column logic circuit of the DRAM in FIG. 1.
Figure 3:
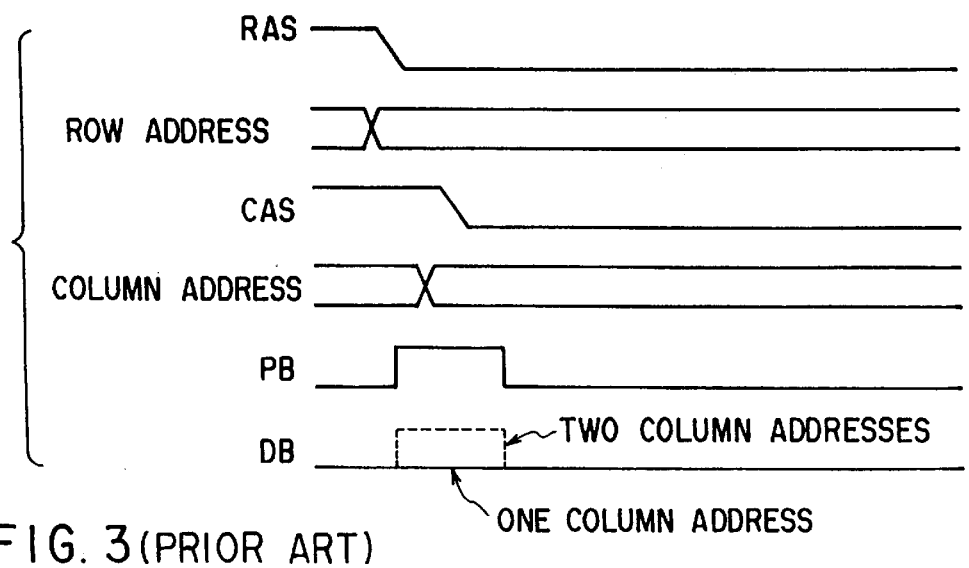
FIG. 3 is a timing chart showing an operation of the DRAM in FIG. 1.
Figure 4:
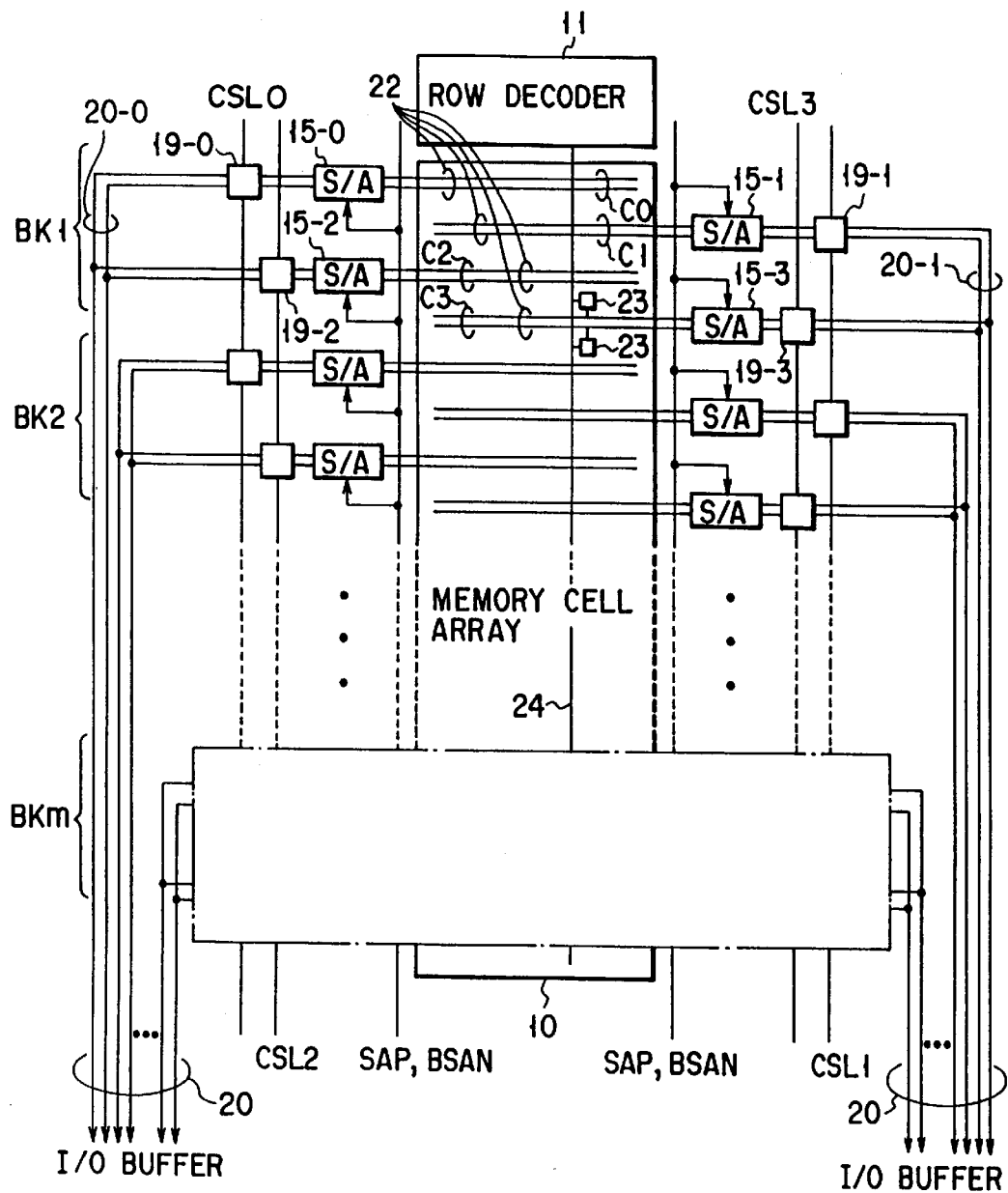
FIG. 4 is a diagram depicting a first example of the layout of a memory cell array and its nearby elements in FIG. 1.
Figure 5:
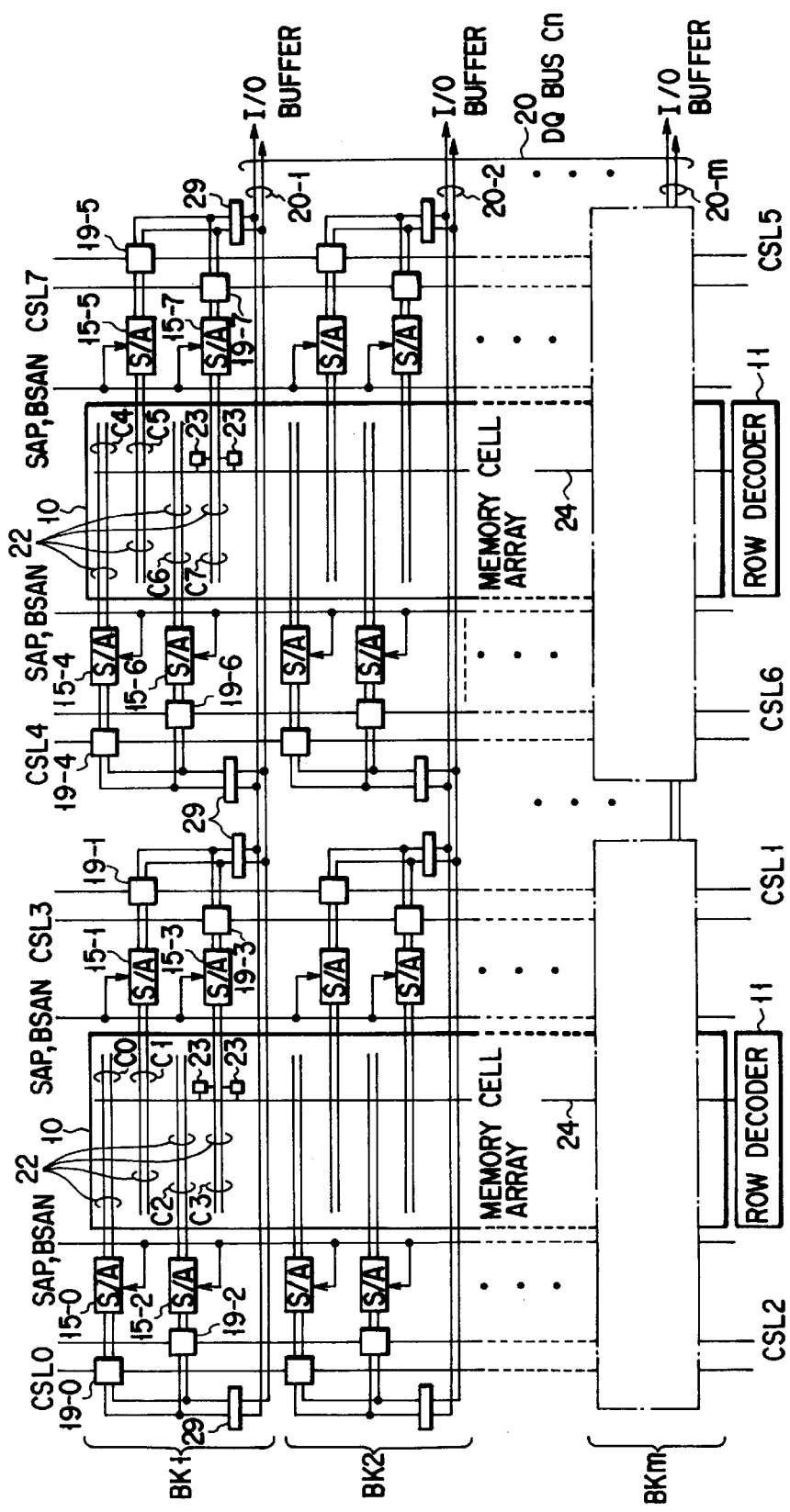
FIG. 5 is a diagram depicting a second example of the layout of the memory cell array and its nearby elements in FIG. 1.
Figure 6:
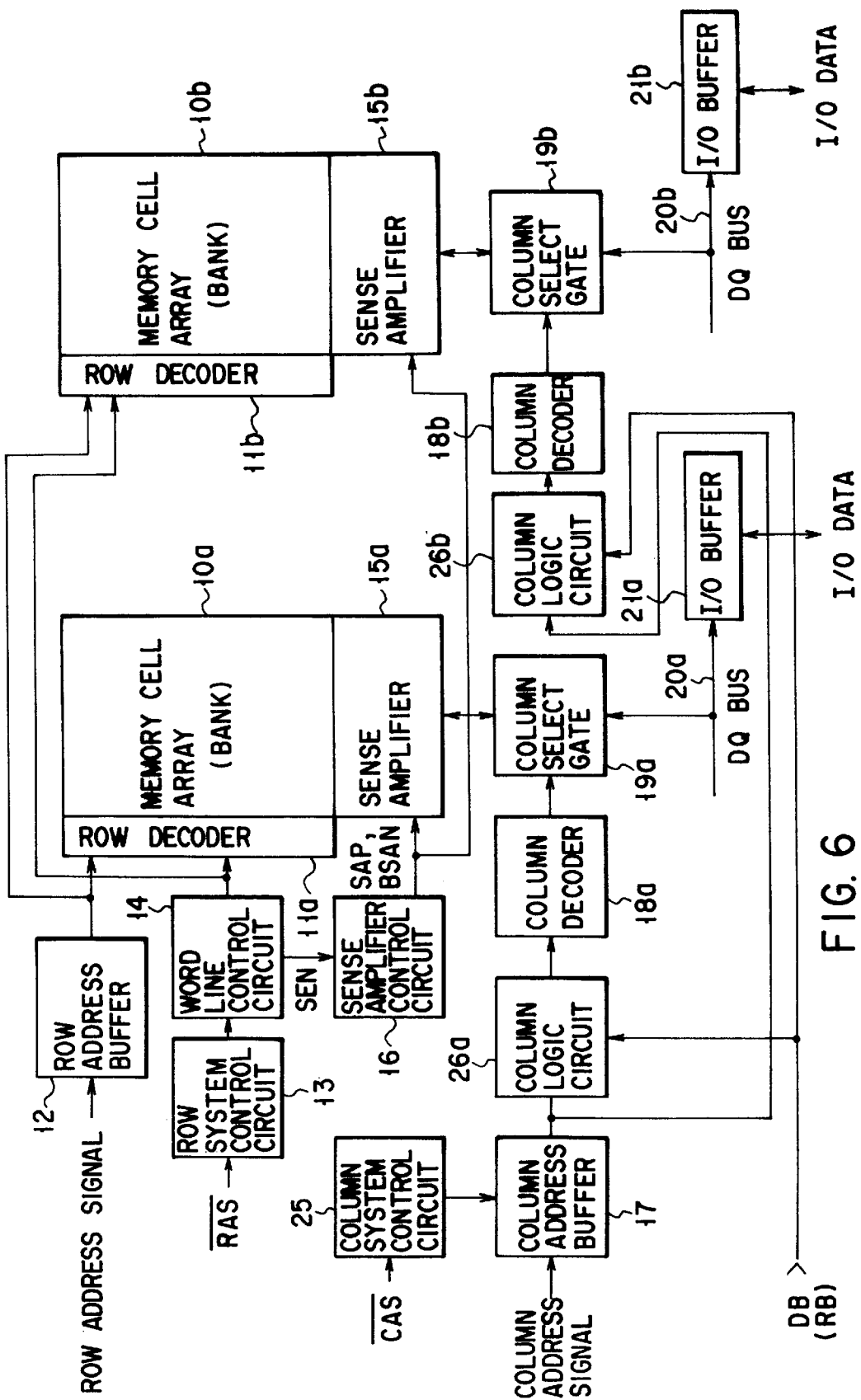
FIG. 6 is a block diagram illustrating a DRAM according to a first embodiment of the present invention.

FIG. 6 illustrates a first embodiment of the semiconductor memory device. As the first embodiment, a DRAM having both a mode in which data is read out of one column of a memory cell array and a mode in which data are simultaneously read out of continuous four columns of the memory cell array, will be described. It makes no difference how many bits one column has.

In the DRAM, a row decoder 11a is arranged at one end of a memory cell array 10a in its row direction (along which a word line extends), while a row decoder 11b is disposed at one end of a memory cell array 10b in its row direction. The row decoders 11a and 11b are supplied with row address signals via a row address buffer 12.

A row address strobe signal $\overline{RAS}$ is input to a row system control circuit 13. A word line control circuit 14 is controlled in response to an output signal of the circuit 13 and applies a high potential to word lines of the memory cell arrays 10a and 10b selected by the row address signals.

A sense amplifier 15a is arranged at another end of the memory cell array 10a in its column direction (along which a pair of bit lines extends), while a sense amplifier 15b is arranged at another end of the memory cell array 10b in its column direction. The sense amplifiers 15a and 15b are activated or inactivated by a sense amplifier control circuit 16.

The sense amplifier control circuit 16 operates in response to an output signal SEN of the word line control circuit 14. More specifically, if rows of the memory cell arrays 10a and 10b are selected and high potentials are applied to the word lines, the sense amplifier control circuit 16 outputs signals SAP and BSAN for activating the sense amplifiers 15a and 15b.

Column address signals are supplied to column logic circuits 26a and 26b through a column address buffer 17. When data are simultaneously read out of continuous four columns of the memory cell arrays, the column logic circuits 26a and 26b generate both an externally input column address signal and a column address signal whose address value is shifted from that of the externally input column address by one.

The column address signals generated from the column logic circuits 26a and 26b are divided as follows. When the column address signal is "010110" (even-numbered column), column decoders 18a and 18b are supplied with column address signals "010110" and "010111," respectively. When the column address signal is "010111" (odd-numbered column), the column decoders 18a and 18b are supplied with column address signals "011000" and "010111," respectively.

The details of the column logic circuits 26a and 26b will be described later.

A column address strobe signal $\overline{CAS}$ is input to a column system control circuit 25. A column address buffer 17 is controlled in response to an output signal of the circuit 25.

The column decoders 18a and 18b open and close column select gates 19a and 19b, respectively. In other words, the column decoders 18a and 18b activate a predetermined one column select line CSLn.

The column logic circuits 26a and 26b are supplied with control signals RB and DB. When the control signal RB is at a high level and the control signal DB is at a low level, the circuits 26a and 26b guide the output signal of the column address buffer 17 to the column decoders 18a and 18b as it is.

The column select gates 19a and 19b corresponding to the column select line CSLn in an activation state, are turned on, and data is read out through the column select gates.

For example, when the control signal DB is at a high level, the column logic circuits 26a and 26b activate continuous two column select lines CSLk and CSLk+2. Four column select gates 19 corresponding to the column select lines CSLn, . . . , CSLn+3 are turned on, and data is read out through each of the column select lines.

A DQ bus 20a is a data path connected between the column select gate 19a and data input/output (I/O) buffer 21a, while a DQ bus 20b is a data path connected between the column select gate 19b and data I/O buffer 21b.

Figure 7:
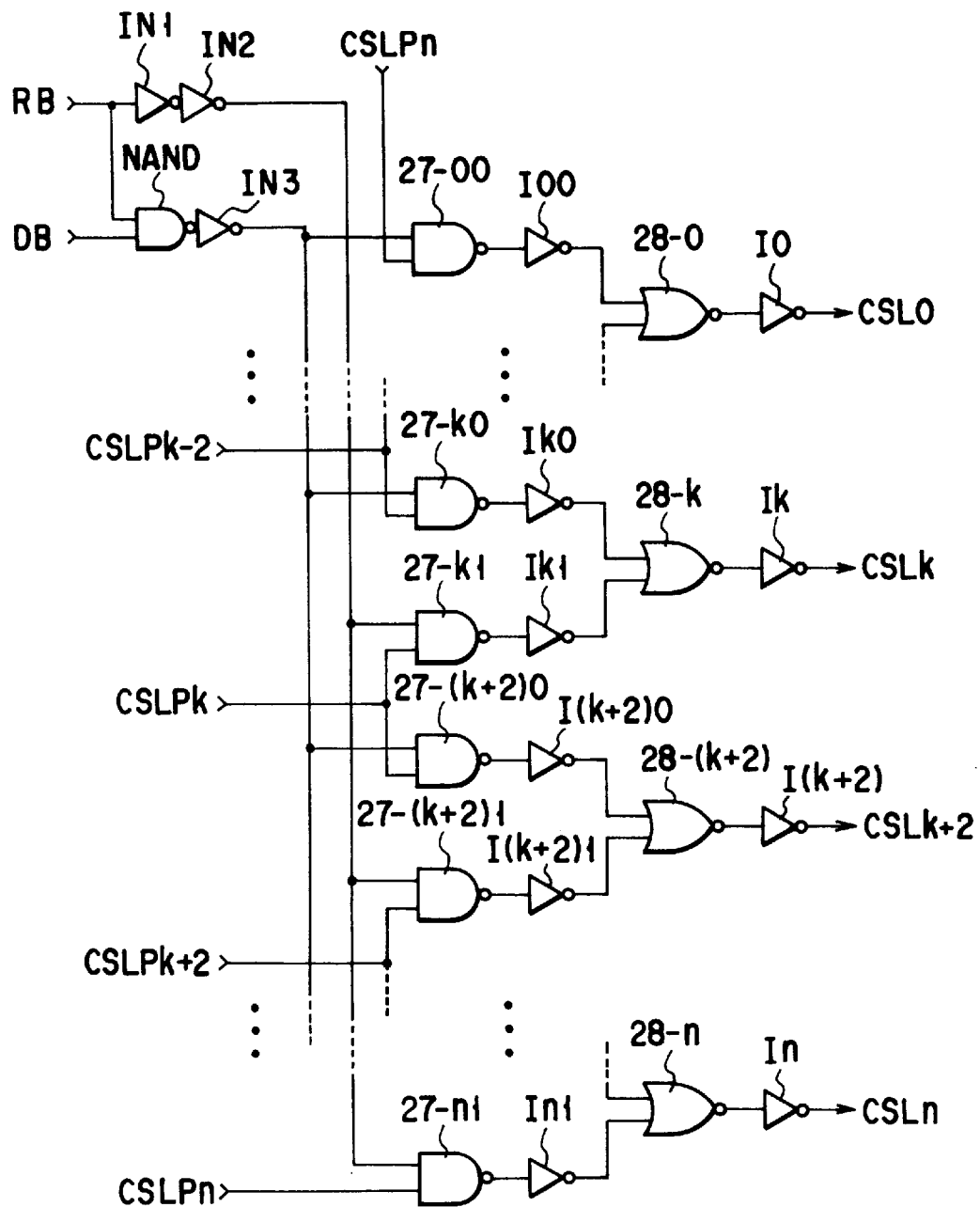
FIG. 7 is a diagram showing an example of a column logic circuit 26a of the DRAM in FIG. 6.

FIG. 7 shows an example of the layout of the column logic circuit 26a of the DRAM of FIG. 6.

In the circuit 26a, the control signal RB is input to a NAND circuit 27-k1 (k even number) via inverters IN1 and IN2 and also input to a NAND circuit NAND, while the control signal DB is input to the NAND circuit NAND. An output signal of the NAND circuit NAND is supplied to a NAND circuit NAND 27-k0 through an inverter IN3. A column select signal CSLPk output from the column decoder, is input to the NAND circuits 27-k1 and 27-(k+2)0. However, a column select signal CSLPn is input to the NAND circuits 27-n1 and 27-00.

The output signal of the NAND circuit 27-k0 is supplied to a NOR circuit 28-k via an inverter Ik0. The output signal of the NAND circuit 27-k1 is input to the NOR circuit 28-k via an inverter Ik1.

If the output signal of the NOR circuit 28-k passes through the inverter Ik, it changes to a final column select signal CSLk.

Figure 8:
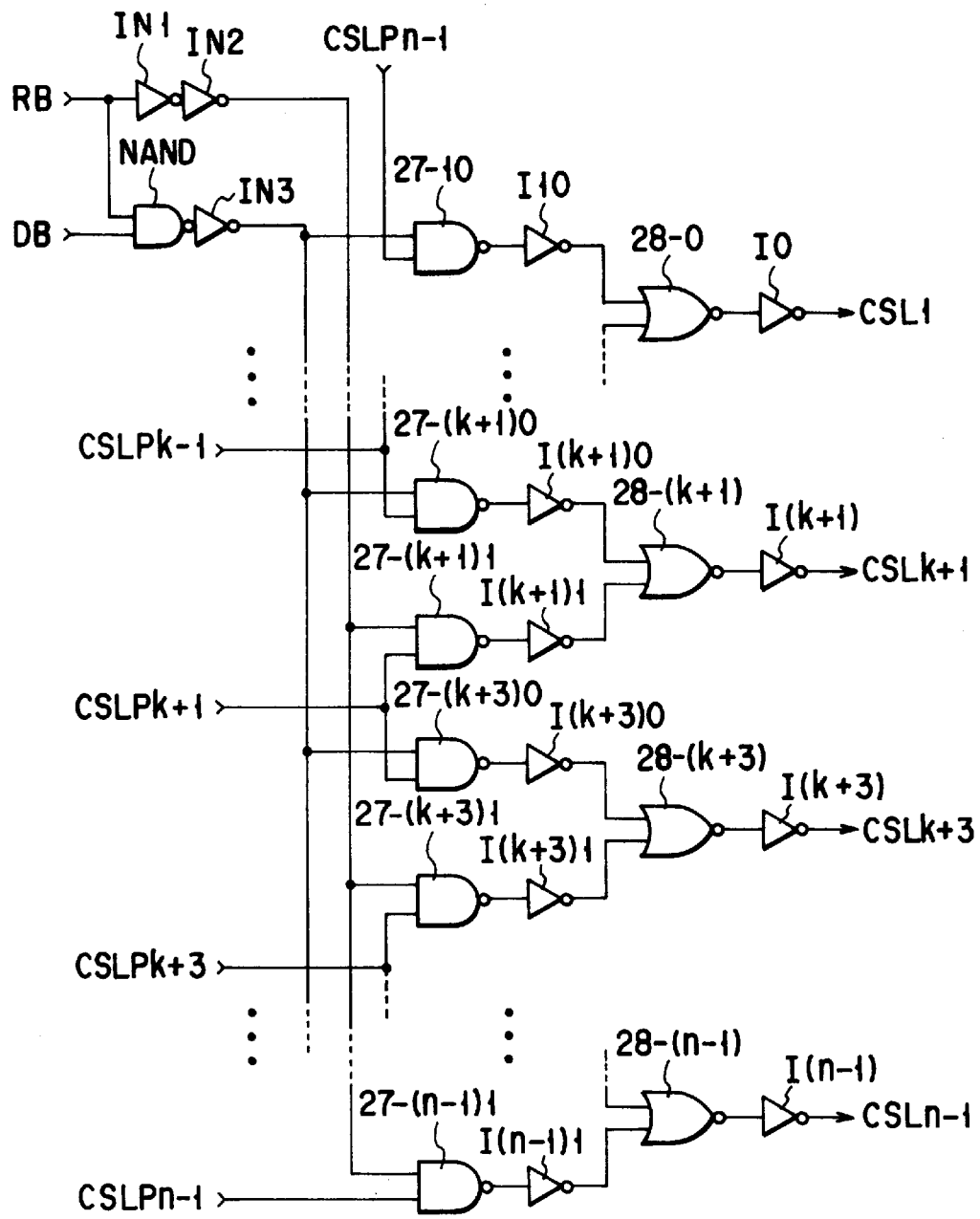
FIG. 8 is a diagram showing an example of a column logic circuit 26b of the DRAM in FIG. 6.

FIG. 8 shows an example of the layout of the column logic circuit 26b of the DRAM of FIG. 6.

In the circuit 26b, the control signal RB is input to a NAND circuit 27-(k+1)1 (k=even number) via inverters IN1 and IN2 and also input to a NAND circuit NAND, while the control signal DB is input to the NAND circuit NAND. An output signal of the NAND circuit NAND is supplied to a NAND circuit NAND 27-(k+1)0 through an inverter IN3.

A column select signal CSLPk output from the column decoder, is input to the NAND circuits 27-(k+1) and 27-(k+3)0. However, a column select signal CSLPn-1 is input to the NAND circuits 27-(n-1)1 and 27-10.

The output signal of the NAND circuit 27-(k+1)0 is supplied to a NOR circuit 28-(k+1) via an inverter I(k+1)0. The output signal of the NAND circuit 27-(k+1)1 is input to the NOR circuit 28-(k+1) via an inverter I(k+1)1.

If the output signal of the NOR circuit 28-(k+1) passes through the inverter I(k+1), it changes to a final column select signal CSLk+1.

Using the above column logic circuits, data can be read out of only one column corresponding to a column address signal and so can be out of one column corresponding to a column address signal and three columns continuous therewith.

An operation of the DRAM shown in FIGS. 6 to 8 will now be described.

When a row address strobe signal RAS changes from a high level to a low level, a row address signal is supplied into a memory chip (semiconductor memory device) in accordance with the change. In response to the row address signal, the row decoder selects a predetermined one row from the memory cell array.

When a column address strobe signal CAS changes from a high level to a low level, a column address signal (e.g., "010110") is supplied into the memory chip in accordance with the change.

a) When data is read out of only one column:

The column logic circuits 26a and 26b supply the column address signal "010110" to the column decoders 18a and 18b as they are. The column address signal is decoded by the column decoder 18a, and a column select signal CSLPk (k is an even number) for selecting a predetermined one of even-numbered columns of the memory cell array 10a is rendered high in level (active). The column select signal CSLPk is input to the column logic circuit 26a. In the column logic circuit 26a, the control signal RB is at a high level, while the control signal DB is at a low level.

Assuming that one column select signal CSLPk (k=any one of 0, 1, . . . , n) is at a high level (in an active state) and the other column select signals CSLP0 to CSLPk-1 and CSLPk+1 to CSLPn are at a low level, the output signals of NAND circuits 27-00 to 27-n0, 27-01 to 27-(k-1)1, and 27-(k+1)1 to 27-n1 become low in level, and only the output signal of NAND circuit 27-k1 becomes high in level. Accordingly, the level of only the output signal of NOR circuit 28-k becomes low and that of only the column select signal CSLk becomes high. The column select signal CSLk turns on a column select gate of a predetermined one column.

b) When data is read out of continuous four columns:

The column logic circuits 26a and 26b generate a column address signal "010111", whose address value is shifted from that of the column address signal "010110", by one. Of these two column address signals, the column address signal "010110" for addressing an even-numbered column is decoded by the column decoder 18a, and a column select signal CSLPk (k is an even number) for selecting a predetermined one of even-numbered columns of the memory cell array 10a is rendered high in level (active). The column address signal "010111" for addressing an odd-numbered column is decoded by the column decoder 18b, and a column select signal CSLPk+1 (k is an even number) for selecting a predetermined one of even-numbered columns of the memory cell array 10b is rendered high in level (active).

The column select signal CSLPk is input to the column logic circuits 26a and 26b. In these circuits, the control signals RB and DB are both at a high level.

Assuming that column select signals CSLPk and CSLPk+1 (k is an even number) are at a high level (in an active state), the output signals of NAND circuits 27-k1 and 27-(k+2)1 become high in level and those of the other NAND circuits become low in level in the column logic circuit 26a. Accordingly, the levels of the output signals of NOR circuits 28-k and 28-(k+2) become low and those of the column select signals CSLk and CSLk+2 become high. The column select signals CSLk and CSLk+2 turn on a column select gate of continuous two columns.

Assuming that column select signals CSLPk and CSLPk+1 (k is an even number) are at a high level (in an active state), the output signals of NAND circuits 27-(k+1)1 and 27-(k+3)1 become high in level and those of the other NAND circuits become low in level in the column logic circuit 26b. Accordingly, the levels of the output signals of NOR circuits 28-(k+1) and 28-(k+3) become low and those of the column select signals CSLk+1 and CSLk+3 become high. The column select signals CSLk+1 and CSLk+3 turn on a column select gate of continuous two columns.

In short, the column select signals CSLk, CSLk+1, CSLk+2, and CSLk+3 are rendered high in level (active), and four columns of the memory cell array are selected.

Figure 9:
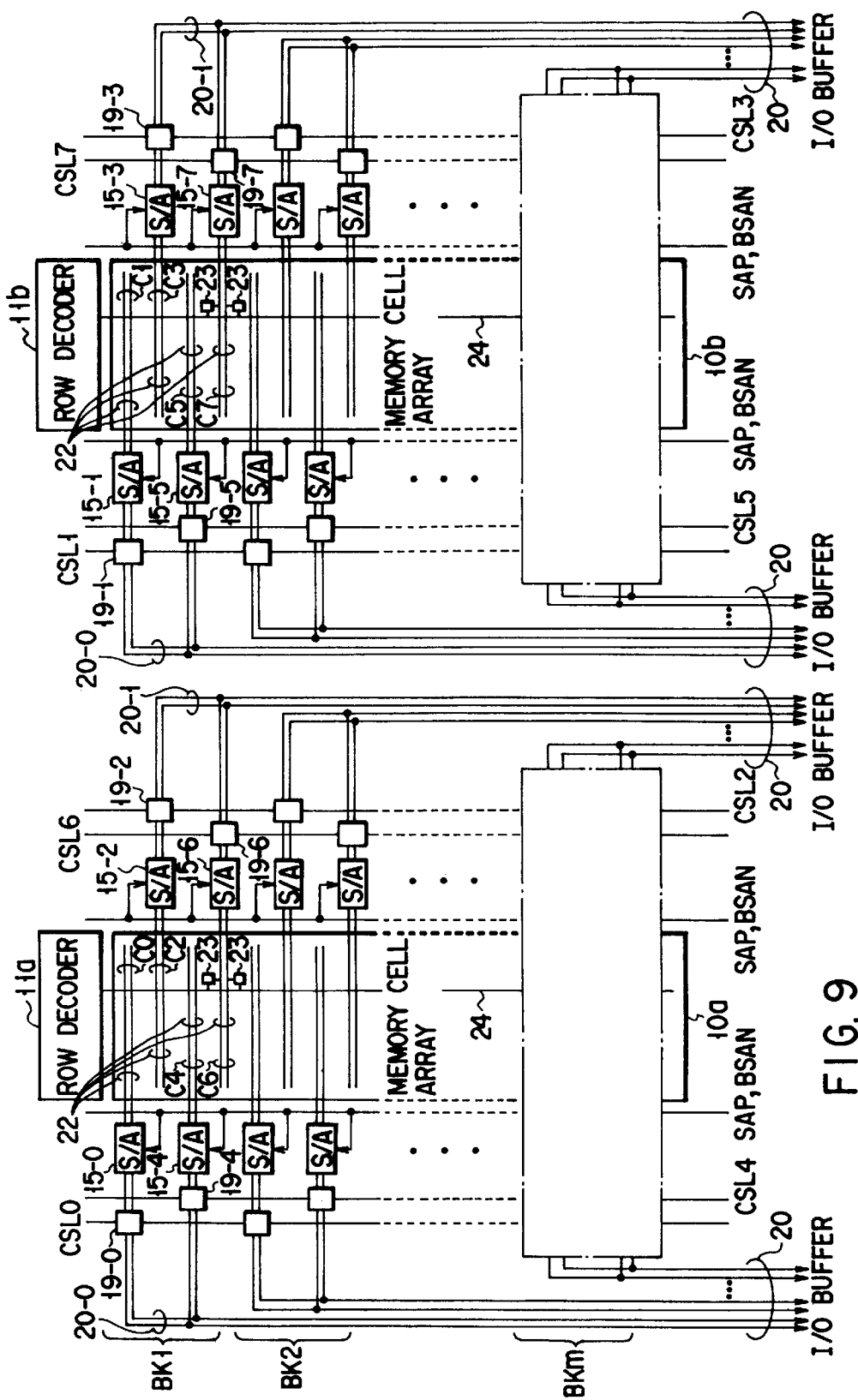
FIG. 9 is a diagram depicting the layout of a memory cell array and its nearby elements in FIG. 6.

FIG. 9 illustrates an example of the layout of the memory cell arrays 10a and 10b, sense amplifiers 15a and 15b and column select gates 19a and 19b of the DRAM of FIG. 6.

The memory cell arrays 10a and 10b are each constituted of m blocks BK1, BK2, . . . , BKm, and the number of bits, which can be read and written at once when only one column is selected, is m bits (×m). The configurations of the blocks BK1, BK2, . . . , BKm are the same.

A word line 24 extends from the row decoders 11a and 11b to a plurality of memory cells 23 disposed on the blocks BK1, BK2, . . . , BKm and belonging to the same row of the memory cell arrays 10a and 10b.

Each of the blocks has eight columns C0 to C7, and a pair of bit lines 22 is formed in each of the columns. The memory cells 23 belonging to the same column of the memory cell arrays 10a and 10b are connected to the bit lines 22.

The pairs of bit lines 22 are connected to a DQ line pair 20 via sense amplifiers 15-0 to 15-7 and column select gates 19-0 to 19-7.

The sense amplifiers 15-0 to 15-7 are activated or inactivated in response to control signals SAP and BSAN. The column select gates 19-0 to 19-7 are opened and closed in response to column select signals CSL0 to CSL7 output from the column decoder.

Since, normally, one column is selected in one block, one of the eight column select gates 19-0 to 19-7 is turned on. When four columns are selected, four of the eight column select gates are turned on and, in this case, the number of bits, which can be read and written at once, is 4 m bits (×4 m). The column select gates 19-0 to 19-7 are constituted of, e.g., N-channel MOS transistors.

The feature of the DRAM having the foregoing layout lies in that the DRAM has two memory cell arrays 10a and 10b, and the even-numbered columns are arranged in the memory cell array 10a while the odd-numbered column is arranged in the memory cell array 10b.

In the memory cell array 10a having even-numbered columns, data of one of continuous two even-numbered columns is guided to one (20-0) of the DQ line pairs, and that of the other even-numbered column is guided to the other DQ line pair 20-1 so as to prevent data of the continuous two even-numbered columns from being guided to the same DQ line pair.

Similarly, in the memory cell array 10b having odd-numbered columns, data of one of continuous two odd-numbered columns is guided to one (20-0) of the DQ line pairs, and that of the other odd-numbered column is guided to the other DQ line pair 20-1 so as to prevent data of the continuous two odd-numbered columns from being guided to the same DQ line pair.

In the above layout, when data are simultaneously read out of continuous four columns, they do not collide with each other.

Figure 10:
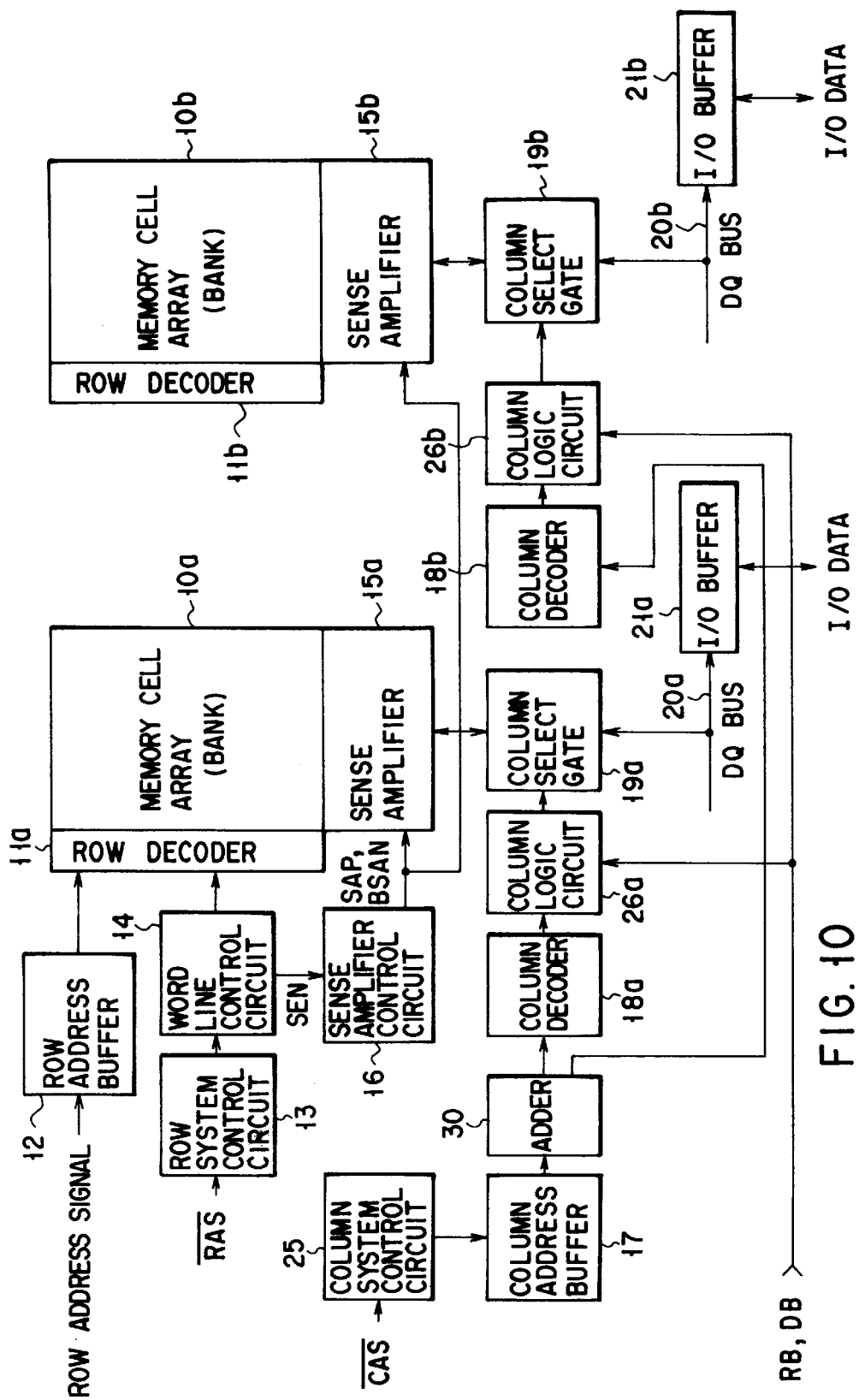
FIG. 10 is a block diagram illustrating a DRAM according to the second embodiment of the present invention.

FIG. 10 illustrates a second embodiment of the semiconductor memory device. As the second embodiment, a DRAM having both a mode in which data is read out of one column of a memory cell array and a mode in which data are simultaneously read out of continuous two columns of the memory cell array, will be described. It makes no difference how many bits one column has.

In the DRAM, a row decoder 11a is arranged at one end of a memory cell array 10a in its row direction (along which a word line extends), while a row decoder 11b is disposed at one end of a memory cell array 10b in its row direction. The row decoders 11a and 11b are supplied with row address signals via a row address buffer 12.

A row address strobe signal $\overline{RAS}$ is input to a row system control circuit 13. A word line control circuit 14 is controlled in response to an output signal of the circuit 13 and applies a high potential to word lines of the memory cell arrays 10a and 10b selected by the row address signals.

A sense amplifier 15a is arranged at another end of the memory cell array 10a in its column direction (along which a pair of bit lines extends), while a sense amplifier 15b is arranged at another end of the memory cell array 10b in its column direction. The sense amplifiers 15a and 15b are activated or inactivated by a sense amplifier control circuit 16.

The sense amplifier control circuit 16 operates in response to an output signal SEN of the word line control circuit 14. More specifically, if rows of the memory cell arrays 10a and 10b are selected and high potentials are applied to the word lines, the sense amplifier control circuit 16 outputs signals SAP and BSAN for activating the sense amplifiers 15a and 15b.

Column address signals are supplied to an adder 30 via a column address buffer 17.

When data are simultaneously read out of continuous two columns of the memory cell array, the adder 30 generates both an externally input column address signal and a column address signal whose address value is shifted from that of the externally input column address by one.

The column address signals generated from the adder 30 are divided as follows. When the column address signal is "010110" (even-numbered column), the column decoder 18a is supplied with a column address signal "010110" as it is and the column decoder 18b is supplied with a column address signal "010111" since the least significant bit is "0." When the column address signal is "010111" (odd-numbered column), the column decoder 18a is supplied with a column address signal "011000", and the column decoder 18b is supplied with a column address signal "010111" as it is since the least significant bit is "1."

A column address strobe signal $\overline{CAS}$ is input to a column system control circuit 25. A column address buffer 17 is controlled in response to an output signal of the circuit 25.

The column decoder 18a opens and closes a column select gate 19a in response to the column address signal for addressing an even-numbered column, while the column decoder 18b opens and closes a column select gate 19b in response to the column address signal for addressing an odd-numbered column. In other words, the column decoders 18a and 18b activate a predetermined one column select line CSLn.

The column logic circuits 26a and 26b are supplied with control signals RB and DB. When the control signal RB is at a high level and the control signal DB is at a low level, the circuits 26a and 26b make all the output signals of the column decoders 18a and 18b low in level. In other words, both the column select gates 19a and 19b are turned off.

When the control signal RB is at a high level and the control signal DB is also at a high level, the circuits 26a and 26b supply output signals of the column decoders 18a and 18b as column select signals CSLk as they are. Then, both the column select gates 19a and 19b are turned on, and data is read out via each of the column select gates.

The column select gates 19a and 19b corresponding to the column select line CSLn in an activation state, are turned on, and data is read out through the column select gates.

For example, when the control signal DB is at a high level, the column logic circuits 26a and 26b activate continuous two column select lines CSLk and CSLk+2. Four column select gates 19 corresponding to the column select lines CSLn, . . . , CSLn+3 are turned on, and data is read out through each of the column select lines.

A DQ bus 20a is a data path connected between the column select gate 19a and data input/output (I/O) buffer 21a, while a DQ bus 20b is a data path connected between the column select gate 19b and data I/O buffer 21b.

Figure 11A:
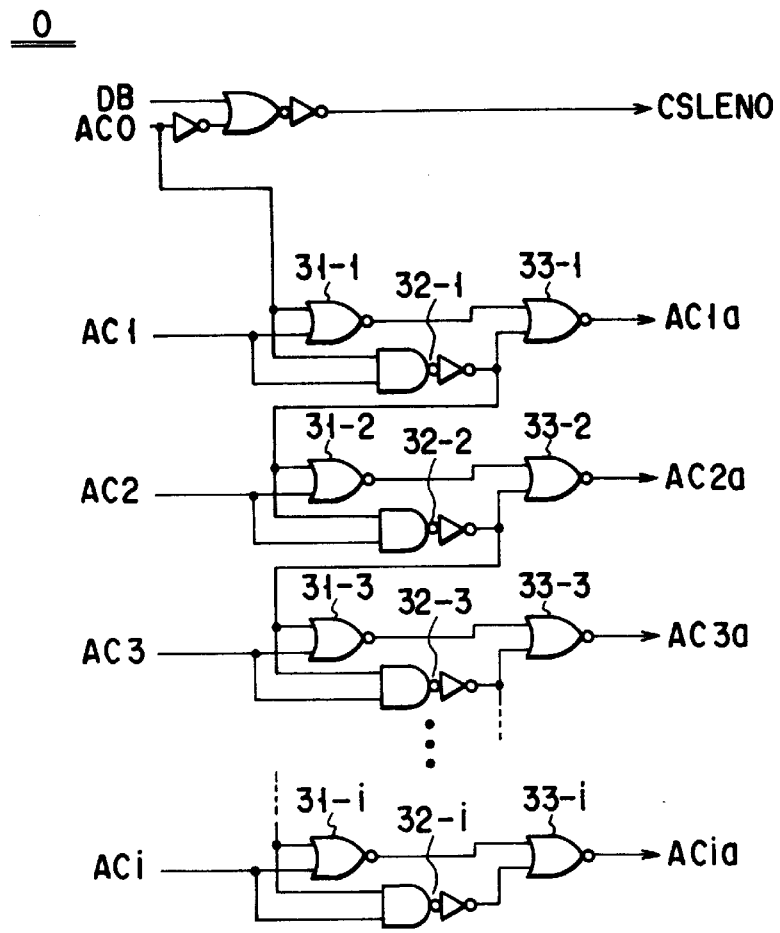
FIG. 11A is a diagram showing part of an adder of the DRAM of FIG. 10.
Figure 11B:
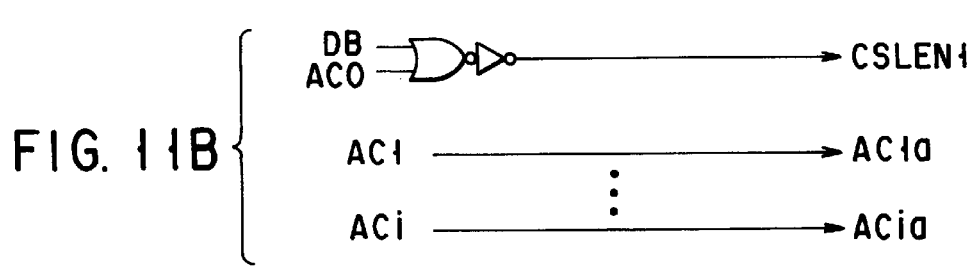
FIG. 11B is a diagram showing part of the adder of the DRAM of FIG. 10.

FIGS. 11A and 11B each illustrate an example of the adder 30 of FIG. 10.

When control signal DB is "0" and signal AC0 is "0," the adder 30 access to only the column select gate 19a and, in this case, it adds no addresses. Since signal CSLEN0 of the column logic circuit 26a is "1," the column select gate 19a is activated. Since signal CSLEN1 of the column logic circuit 26b is "0," the column select gate 19b is inactivated. Signal AC0 is "0" and thus no addresses are added.

When control signal DB is "0" and signal AC0 is "1," the adder 30 access to only the column select gate 19b and, in this case, it adds no addresses. Since signal CSLEN1 of the column logic circuit 26b is "1," the column select gate 19b is activated. Since signal CSLEN0 of the column logic circuit 26a is "0," the column select gate 19a is inactivated.

When control signal DB is "1" and signal AC0 is "0," the adder 30 access to the column select gates 19a and 19b and, in this case, it adds no addresses since signal AC0 is "0" in the column logic circuit 26a. In the column logic circuit 26b, the control signal CSLEN1 is "1" and thus the column select gate 19b is activated.

When control signal DB is "1" and signal AC0 is "1," the adder 30 access to the column select gates 19a and 19b and, in this case, it adds addresses since AC0 is "1" in the column logic circuit 26a. In the column logic circuit 26b, an input address is accessed as it is.

Signal AC0 is not an input of the column decoder but used for decoding. In the second embodiment, the selection of the column select gate 19a or 19b depends upon the value of signal AC0.

Figures 12, 13A, 13B, 13C:
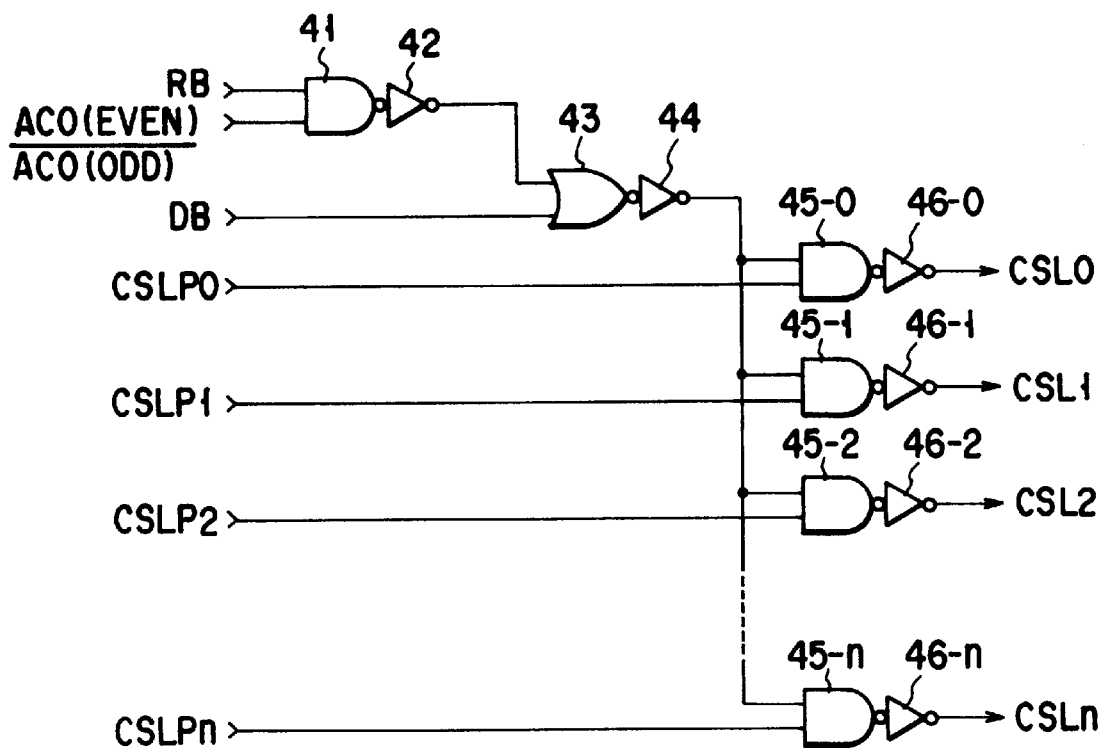
FIG. 12 is a diagram illustrating an example of a column logic circuit of the DRAM of FIG. 10.
FIG. 13A is a diagram depicting the layout of a memory cell array and its nearby elements of FIG. 10.
FIG. 13B is a diagram depicting the layout of a memory cell array and its nearby elements of FIG. 10.
FIG. 13C is a diagram depicting the layout of a memory cell array and its nearby elements of FIG. 10.
Figure 13B:
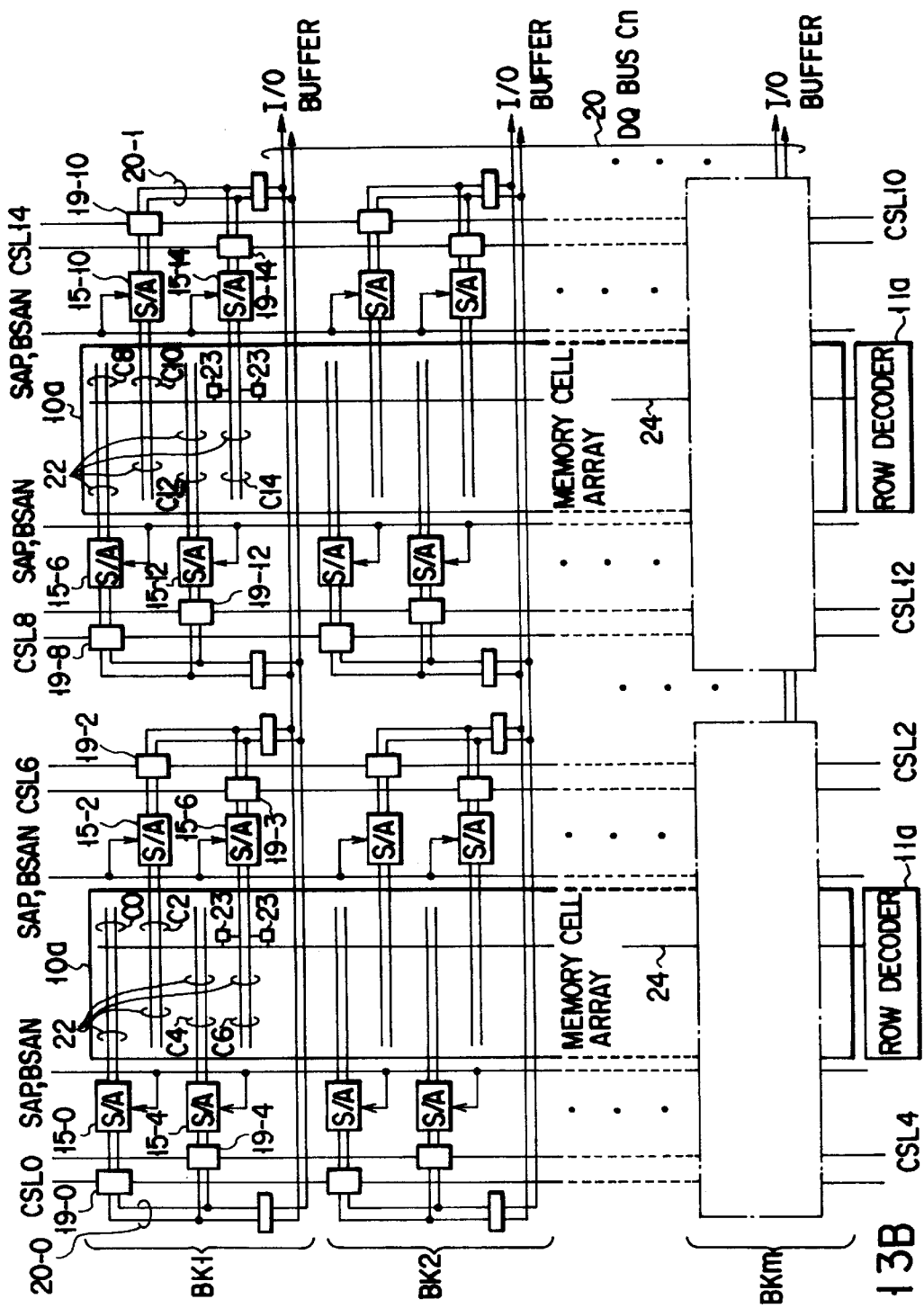
Figure 13C:
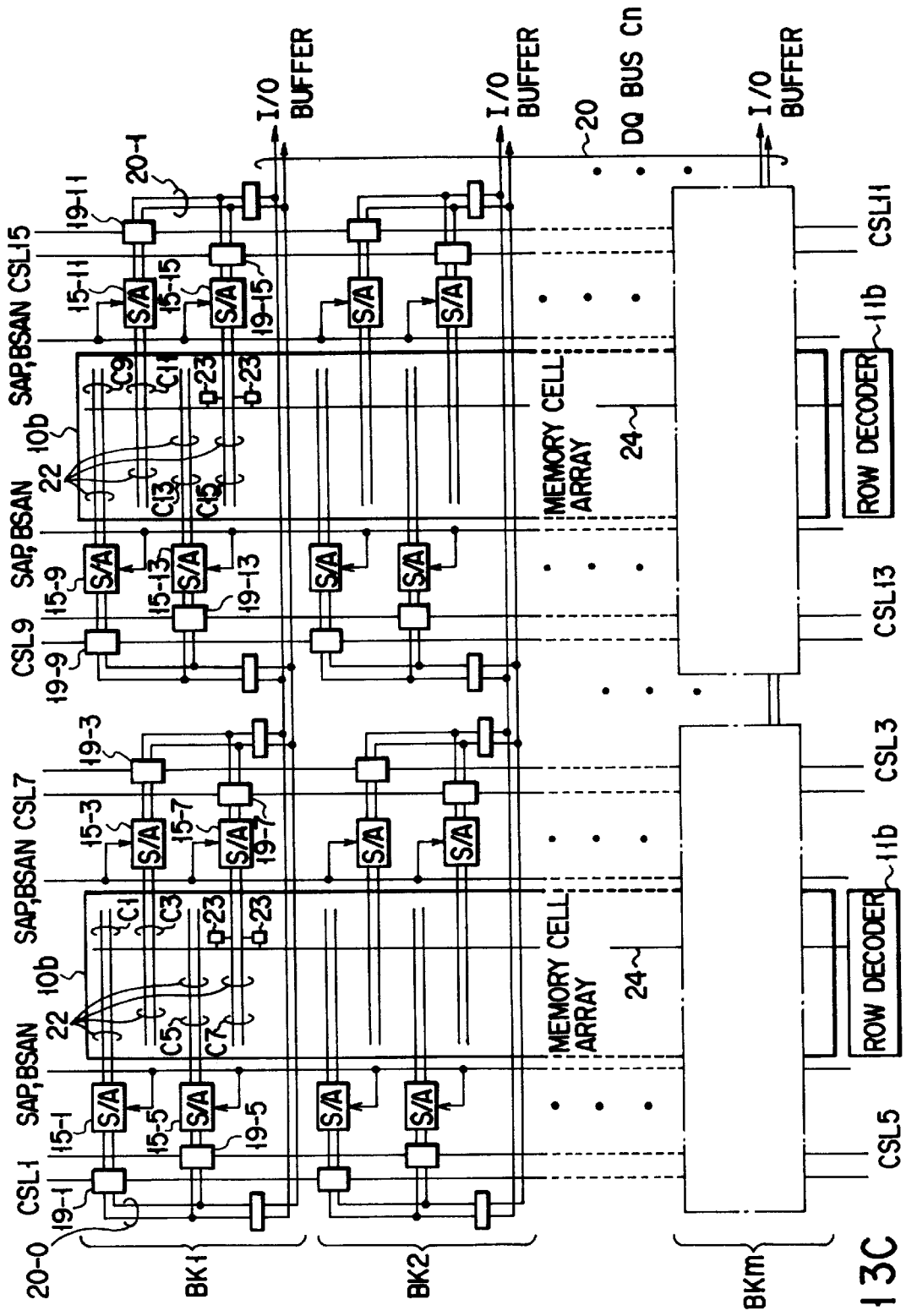

FIG. 12 illustrates an example of the column logic circuits 26a and 26b of FIG. 10.

In the column logic circuit 26a, a NAND circuit 41 is supplied with both a control signal RB and the least significant bit AC0 (even) of a column address signal. In the column logic circuit 26b, the NAND circuit 41 is supplied with both a control signal RB and the least significant bit $\overline{AC0}$ (odd) of a column address signal.

The output signal of the NAND circuit 41 is input to a NOR circuit 43 via an inverter 42. The NOR circuit 43 is supplied with a control signal DB. The output signal of the NOR circuit 43 is input to a NAND circuit 45-k (k=1, 2, . . . , n) through an inverter 44. The NAND circuit 45-k is supplied with a column select signal CSLPk (k=1, 2, . . . , n). The output signal of the NAND circuit 45-k is changed into the final column select signals CSL0 to CSLn through an inverter 46-k.

Using the column logic circuits, data can be read out of not only one column corresponding to a column address signal but also two columns, that is, one column corresponding to a column address signal and the other continuous therewith.

An operation of the DRAM shown in FIGS. 10 to 12 will now be described.

When a row address strobe signal RAS changes from a high level to a low level, a row address signal is supplied into a memory chip (semiconductor memory device) in accordance with the change. In response to the row address signal, the row decoder selects a predetermined one row from the memory cell array.

When a column address strobe signal CAS changes from a high level to a low level, a column address signal (e.g., "010110") is supplied into the memory chip in accordance with the change.

a) When data is read out of only one column:

The adder 30 supplies the column address signal "010110" to the column decoders 18a and 18b as they are. The column address signal is decoded by the column decoder 18a, and a column select signal CSLPk (k is an even number) for selecting a predetermined one of even-numbered columns of the memory cell array 10a is rendered high in level (active). The column select signal CSLPk is input to the column logic circuit 26a. In the column logic circuit 26a, the control signals RB and DB are both at a high level.

Assuming that one column select signal CSLPk (k=any one of 0, 1, . . . , n) is at a high level (in an active state) and the other column select signals are at a low level, only the output signal of the NAND circuit 45-k supplied with the high-level column select signal CSLPk, becomes low in level, and only the column select signal CSLk becomes high in level. The column select signal CSLk turns on a column select gate of a predetermined one column.

b) When data is read out of continuous two columns:

The adder 30 generates a column address signal "010111" whose address value is shifted from that of the column address signal "010110" by one. Of these two column address signals, the column address signal "010110" for addressing an even-numbered column is decoded by the column decoder 18a, and a column select signal CSLPk (k is an even number) for selecting a predetermined one of even-numbered columns of the memory cell array 10a is rendered high in level (active). The column address signal "010111" for addressing an odd-numbered column is decoded by the column decoder 18b, and a column select signal CSLPk+1 (k is an even number) for selecting a predetermined one of even-numbered columns of the memory cell array 10b is rendered high in level (active).

The column select signal CSLPk is input to the column logic circuits 26a and 26b. In these circuits, the control signals RB and DB are both at a high level.

Assuming that, in the column logic circuits 26a and 26b, one column select signal CSLPk (k is any one of 0, 1, . . . , n) is at a high level (in an active state) and the other column select signals are at a low level, only the output signal of the NAND circuit 45-k supplied with the high-level column select signal CSLPk, becomes low in level, and only the column select signal CSLk becomes high in level. Accordingly, the column select signal CSLk turns on a column select gate of predetermined two columns.

FIGS. 13A, 13B and 13C illustrate examples of the layout of the memory cell arrays 10a and 10b, sense amplifiers 15a and 15b and column select gates 19a and 19b of the DRAM of FIG. 10.

The memory cell arrays 10a and 10b are each constituted of m blocks BK1, BK2, . . . , BKm, and the number of bits, which can be read and written at once when only one column is selected, is m bits (×m). The configurations of the blocks BK1, BK2, . . . , BKm are the same.

A word line 24 extends from the row decoders 11a and 11b to a plurality of memory cells 23 disposed on the blocks BK1, BK2, . . . , BKm and belonging to the same row of the memory cell arrays 10a and 10b.

Each of the blocks has sixteen columns C0 to C15, and a pair of bit lines 22 is formed in each of the columns. The memory cells 23 belonging to the same column of the memory cell arrays 10a and 10b are connected to the bit lines 22.

The pairs of bit lines 22 are connected to a DQ line pair 20 via sense amplifiers 15-0 to 15-15 and column select gates 19-0 to 19-15.

The sense amplifiers 15-0 to 15-15 are activated or inactivated in response to control signals SAP and BSAN. The column select gates 19-0 to 19-15 are opened and closed in response to column select signals CSL0 to CSL15 output from the column decoder.

Since, normally, one column is selected in one block, one of the sixteen column select gates 19-0 to 19-15 is turned on. When two columns are selected, two of the sixteen column select gates are turned on and, in this case, the number of bits, which can be read and written at once, is 2 m bits (×2 m). The column select gates 19-0 to 19-15 are constituted of, e.g., N-channel MOS transistors.

The feature of the DRAM having the foregoing layout lies in that the DRAM has two memory cell arrays 10a and 10b, and the even-numbered columns are arranged in the memory cell array 10a while the odd-numbered column is arranged in the memory cell array 10b.

In the memory cell array 10a having even-numbered columns, data of one of continuous two even-numbered columns is guided to one (20-0) of the DQ line pairs, and that of the other even-numbered column is guided to the other DQ line pair 20-1 so as to prevent data of the continuous two even-numbered columns from being guided to the same DQ line pair.

Similarly, in the memory cell array 10b having odd-numbered columns, data of one of continuous two odd-numbered columns is guided to one (20-0) of the DQ line pairs, and that of the other odd-numbered column is guided to the other DQ line pair 20-1 so as to prevent data of the continuous two odd-numbered columns from being guided to the same DQ line pair.

In the above layout, when data are simultaneously read out of continuous two columns, they do not collide with each other.

As described above, the semiconductor memory device of the present invention has the following advantages.

The memory cell array is divided into two. One memory cell array includes even-numbered columns, while the other has odd-numbered columns.

In each of the two memory cell arrays, data of one of continuous two even-numbered or odd-numbered columns is guided to one of the DQ line pairs, and that of the other even-numbered or odd-numbered column is guided to the other DQ line pair so as to prevent data of the continuous two even-numbered or odd-numbered columns from being guided to the same DQ line pair.

Consequently, in the above layout of the memory cell array, when data are simultaneously read out of continuous two or more columns, they do not collide with each other or the chip does not increase in area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A semiconductor memory device comprising:
a memory cell array including a first bank and a second bank;
even-numbered columns arranged in the first bank;
odd-numbered columns arranged in the second bank;
a circuit for reading data out of one of the first bank and the second bank in a first mode where the data is read out of one column, and for reading data out of both the first bank and the second bank in a second mode where the data is simultaneously read out of two or more continuous columns included in the even-numbered and odd-numbered columns;
a circuit for, in response to receiving a first column address signal for selecting one of the columns of said memory cell array, generating in the second mode a second column address signal having an address value shifted by one from an address value of the first column address signal;
a first column decoder for decoding in the second mode the first column address signal to generate a first column select signal, the first column select signal selecting a column from either the even-numbered columns or the odd-numbered columns; and
a second column decoder for decoding in the second mode the second column address signal to generate a second column select signal, the second column select signal selecting a column from either the odd-numbered columns or the even-numbered columns.

2. The semiconductor memory device according to claim 1, further comprising:
a first bit line pair formed in one of two continuous even-numbered columns in the first bank;
a second bit line pair formed in the other of the two continuous even-numbered columns in the first bank;
a first data line pair formed at a first side of the first bank and connected to said first bit line pair; and
a second data line pair formed at a second side of the first bank and connected to said second bit line pair.

3. The semiconductor memory device according to claim 1, further comprising:
a first bit line pair formed in one of continuous odd-numbered columns in the second bank;
a second bit line pair formed in the other of the two continuous odd-numbered columns in the second bank;
a first data line pair formed at a first side of the second bank and connected to said first bit line pair; and
a second data line pair formed at a second side of the second bank and connected to said second bit line pair.

4. The semiconductor memory device according to claim 1, further comprising:
a first column logic circuit for generating a third column select signal, the third column select signal selecting a column continuous with the column selected by the first column select signal; and
a second column logic circuit for generating a fourth column select signal, the fourth column select signal selecting a column continuous with the column selected by the second column select signal.

5. The semiconductor memory device according to claim 1, wherein m bits of data are simultaneously read out of one of the columns of said memory cell array, m being a natural number.

6. The semiconductor memory device of claim 1, wherein the semiconductor memory device is configured such that the first column select signal selects a column from the even-numbered columns and the second column select signal selects a column from the odd-numbered columns.

7. A semiconductor memory device comprising:

a memory cell array including a first bank and a second bank;

even-numbered columns arranged in the first bank;

odd-numbered columns arranged in the second bank;

an adder for generating a second column address signal in response to a first column address signal, the first column address signal selecting one of the columns of said memory cell array, the second column address signal having an address value shifted by one from an address value of the first column address signal;

a first column decoder for decoding the first column address signal to generate a first column select signal;

a second column decoder for decoding the second column address signal to generate a second column select signal; and a circuit for outputting data from one of the first bank and the second bank based on one of the first column select signal and the second column select signal in a first mode wherein the data from one of the even-numbered or odd-numbered columns is read out, and for simultaneously outputting data from both the first bank and the second bank based on both the first column select signal and the second column select signal in a second mode wherein the data of continuous two or more of the even-numbered and odd-numbered columns is read out.

8. The semiconductor memory device according to claim 7, further comprising:

a first bit line pair formed in one of two continuous even-numbered columns in the first bank;

a second bit line pair formed in the other of the two continuous even-numbered columns in the first bank;

a first data line pair formed at a first side of the first bank and connected to said first bit line pair; and a second data line pair formed at a second side of the first bank and connected to said second bit line pair.

9. The semiconductor memory device according to claim 7, further comprising:

a first bit line pair formed in one of two continuous odd-numbered columns in the second bank;

a second bit line pair formed in the other of the two continuous odd-numbered columns in the second bank;

a first data line pair formed at a first side of the second bank and connected to said first bit line pair; and a second data line pair formed at a second side of the second bank and connected to said second bit line pair.

10. The semiconductor memory device according to claim 7, further comprising:

a first column logic circuit for generating a third column select signal, the first column select signal selecting a column from either the even-numbered columns or the odd-numbered columns, the third column select signal selecting a column continuous with the column selected by the first column select signal; and a second column logic circuit for generating a fourth column select signal, the second column select signal selecting a column from either the even-numbered columns or the odd-numbered columns, the fourth column select signal being used for selecting a column continuous with the column selected by the second column select signal.

11. The semiconductor memory device of claim 10, wherein the semiconductor memory device is configured such that the first column select signal selects a column from the even-numbered columns and the second column select signal selects a column from the odd-numbered columns.

12. The semiconductor memory device according to claim 7, wherein m bits of data are simultaneously read out of one of the columns of said memory cell array, m being a natural number.

* * * * *